(12) United States Patent
Wayman et al.

(10) Patent No.: US 7,864,534 B2
(45) Date of Patent: Jan. 4, 2011

(54) APPARATUS FOR MOUNTING A MODULE AND ENABLING HEAT CONDUCTION FROM THE MODULE TO THE MOUNTING SURFACE

(75) Inventors: Michael J. Wayman, Waconia, MN (US); Michael J. Nelson, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 142 days.

(21) Appl. No.: 12/137,297

(22) Filed: Jun. 11, 2008

(65) Prior Publication Data

US 2009/0310312 A1 Dec. 17, 2009

(51) Int. Cl.
*H05K 7/20* (2006.01)
*H01L 23/34* (2006.01)
*H05K 5/00* (2006.01)
*H05K 1/14* (2006.01)
*H05K 7/00* (2006.01)
*A41F 1/00* (2006.01)
*F28F 7/00* (2006.01)

(52) U.S. Cl. .................. 361/716; 257/718; 257/726; 257/E23.103; 361/732; 361/709; 361/747; 361/715; 24/458; 24/520; 165/80.2; 165/185; 174/548

(58) Field of Classification Search .......... 361/704, 361/707, 709–711, 714–716, 732–747, 679.31–679.4, 361/679.55, 679.58, 724–727; 257/718; 312/100, 324, 327, 328; 439/157, 60, 152–153, 439/327, 328, 331

See application file for complete search history.

(56) References Cited

U.S. PATENT DOCUMENTS

| 4,371,757 | A | 2/1983 | Debortoli et al. |
| 4,549,602 | A | 10/1985 | Espinoza |
| 5,267,762 | A | 12/1993 | Gromotka |
| 5,710,804 | A | 1/1998 | Bhame et al. |
| 5,894,407 | A | 4/1999 | Aakalu et al. |
| 6,065,612 | A | 5/2000 | Rinderer |
| 6,082,441 | A | 7/2000 | Boehmer et al. |
| 6,116,615 | A | 9/2000 | Trehan |
| 6,142,595 | A | 11/2000 | Dellapi et al. |

(Continued)

*Primary Examiner*—Zachary M Pape
*Assistant Examiner*—Jerry Wu
(74) *Attorney, Agent, or Firm*—Fogg & Powers LLC

(57) ABSTRACT

An electronics enclosure is provided. The electronics enclosure includes a heat dissipating body comprising: a heat conducting surface, a first flange adjacent to the heat conducting surface, and a first part of a latch mechanism adjacent to the heat conducting surface. The first part of the latch mechanism is adjacent an edge of the heat conducting surface opposite to the first flange, such that a portion of the heat conducting surface is between the first flange and the first part of the latch mechanism. The electronics enclosure also includes a plurality of electronic modules configured to mount to the heat dissipating body. Each of the plurality of electronic modules comprises: a plurality of electronic components, a heat conducting side configured to contact the heat conducting surface of the heat dissipating body, a second flange adjacent the heat conducting side, the second flange configured to couple with the first flange, and a second part of the latch mechanism adjacent the heat conducting side, the second part of the latch mechanism configured to couple with the first part of the latch mechanism. The second flange and the second part of the latch mechanism are on opposite edges of the heat conducting side.

18 Claims, 16 Drawing Sheets

U.S. PATENT DOCUMENTS

| | | |
|---|---|---|
| 6,238,027 B1 | 5/2001 | Kohler et al. |
| 6,340,317 B1 | 1/2002 | Lin |
| 6,556,443 B1 * | 4/2003 | Wei .......................... 361/704 |
| 6,579,029 B1 | 6/2003 | Sevde et al. |
| 6,968,647 B2 | 11/2005 | Levesque et al. |
| 7,225,586 B2 | 6/2007 | Levesque et al. |
| 2003/0193774 A1 * | 10/2003 | Shyr ........................ 361/683 |
| 2004/0222517 A1 * | 11/2004 | Robertson et al. .......... 257/718 |
| 2006/0246276 A1 * | 11/2006 | Chung ....................... 428/323 |
| 2007/0025068 A1 * | 2/2007 | Chen et al. ................. 361/679 |
| 2007/0247809 A1 | 10/2007 | McClure |

* cited by examiner

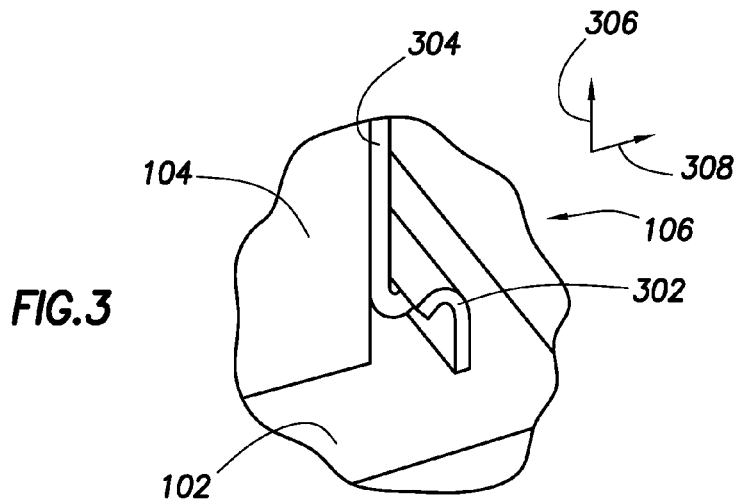
FIG.3
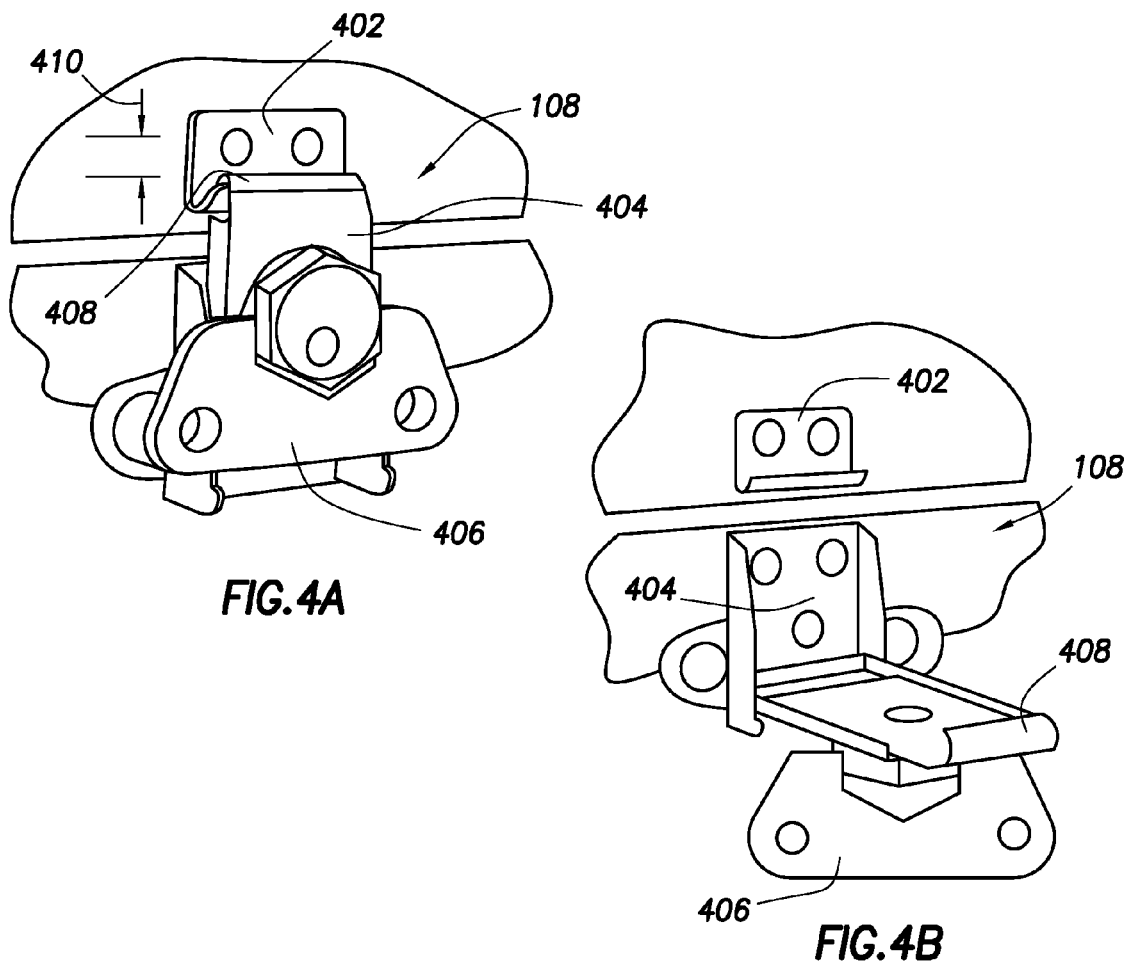
FIG.4A
FIG.4B

APPARATUS FOR MOUNTING A MODULE AND ENABLING HEAT CONDUCTION FROM THE MODULE TO THE MOUNTING SURFACE

CROSS REFERENCE TO RELATED APPLICATIONS

This application is related to the following co-pending United States patent applications filed on even date herewith, all of which are hereby incorporated herein by reference:

U.S. patent application Ser. No. 12/137,322 entitled "COMMUNICATION MODULES") and which is referred to here as the '1027 Application;

U.S. patent application Ser. No. 61/060,589 entitled "SUSPENSION METHOD FOR COMPLIANT THERMAL CONTACT OF ELECTRONICS MODULES") and which is referred to here as the '1029 Application;

U.S. patent application Ser. No. 12/137,307 entitled "ANGLED DOORS WITH CONTINUOUS SEAL") and which is referred to here as the '1030 Application;

U.S. patent application Ser. No. 61/060,523 entitled "L-SHAPED DOOR WITH 3-SURFACE SEAL FOR END-PLATES") and which is referred to here as the '1031 Application;

U.S. patent application Ser. No. 61/060,576 entitled "L-SHAPED DOORS WITH TRAPEZOIDAL SEAL") and which is referred to here as the '1032 Application;

U.S. patent application Ser. No. 12/137,309 entitled "SYSTEMS AND METHODS FOR VENTURI FAN-ASSISTED COOLING") and which is referred to here as the '1033 Application;

U.S. patent application Ser. No. 61/060,547 entitled "COMBINATION EXTRUDED AND CAST METAL OUTDOOR ELECTRONICS ENCLOSURE") and which is referred to here as the '1034 Application;

U.S. patent application Ser. No. 61/060,584, entitled "SYSTEMS AND METHODS FOR CABLE MANAGEMENT" and which is referred to here as the '1035 Application;

U.S. patent application Ser. No. 61/060,581 entitled "CAM SHAPED HINGES") and which is referred to here as the '1037 Application;

U.S. patent application Ser. No. 12/137,313 entitled "SOLAR SHIELDS") and which is referred to here as the '1038 Application;

U.S. patent application Ser. No. 61/060,501 entitled "APPARATUS AND METHOD FOR BLIND SLOTS FOR SELF DRILLING/SELF-TAPPING SCREWS") and which is referred to here as the '1039 Application;

U.S. patent application Ser. No. 61/060,593 entitled "SYSTEMS AND METHODS FOR THERMAL MANAGEMENT") and which is referred to here as the '1040 Application;

U.S. patent application Ser. No. 61/060,762 entitled "SERF BOARD COMPONENTS") and which is referred to here as the '1062 Application; and U.S. patent application Ser. No. 61/060,740 entitled "PULL-OUT SHELF FOR USE IN A CONFINED SPACE FORMED IN A STRUCTURE") and which is referred to here as the '1064 Application.

BACKGROUND

For many years outdoor electronic enclosures have been mounted on utility poles high above the ground. To access the enclosure for repairs or maintenance a serviceperson is usually lifted in the boom of a boom truck to the height of the enclosure. In other situations, a serviceperson may be able to use a ladder. In either case the serviceperson has a limited range of motion while accessing the electronic enclosure. Additionally, the serviceperson probably has minimal immediate access to tools while accessing the electronic enclosure.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention. In one embodiment, an electronics enclosure is provided. The electronics enclosure includes a heat dissipating body comprising: a heat sink having a heat conducting surface, a first flange adjacent to the heat conducting surface, and a first part of a latch mechanism adjacent to the heat conducting surface. The first part of the latch mechanism is adjacent an edge of the heat conducting surface opposite to the first flange, such that a portion of the heat conducting surface is between the first flange and the first part of the latch mechanism. The electronics enclosure also includes a plurality of electronic modules configured to mount to the heat dissipating body. Each of the plurality of electronic modules comprises: a plurality of electronic components, a heat conducting side configured to contact the heat conducting surface of the heat dissipating body, a second flange adjacent the heat conducting side, the second flange configured to couple with the first flange, and a second part of the latch mechanism adjacent the heat conducting side, the second part of the latch mechanism configured to couple with the first part of the latch mechanism. The second flange and the second part of the latch mechanism are on opposite edges of the heat conducting side.

BRIEF DESCRIPTION OF THE DRAWINGS

The present invention can be more easily understood, and further advantages and uses thereof are more readily apparent, when considered in view of the detailed description and the following figures in which:

FIG. 3 is an enlarged perspective view of one embodiment of interlocking flanges of FIGS. 1 and 2;

FIGS. 4A and 4B are perspective views of one embodiment of a latch mechanism of FIGS. 1 and 2;

In accordance with common practice, the various described features are not drawn to scale but are drawn to emphasize specific features relevant to the present invention. Like reference characters denote like elements throughout the Figures and text.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
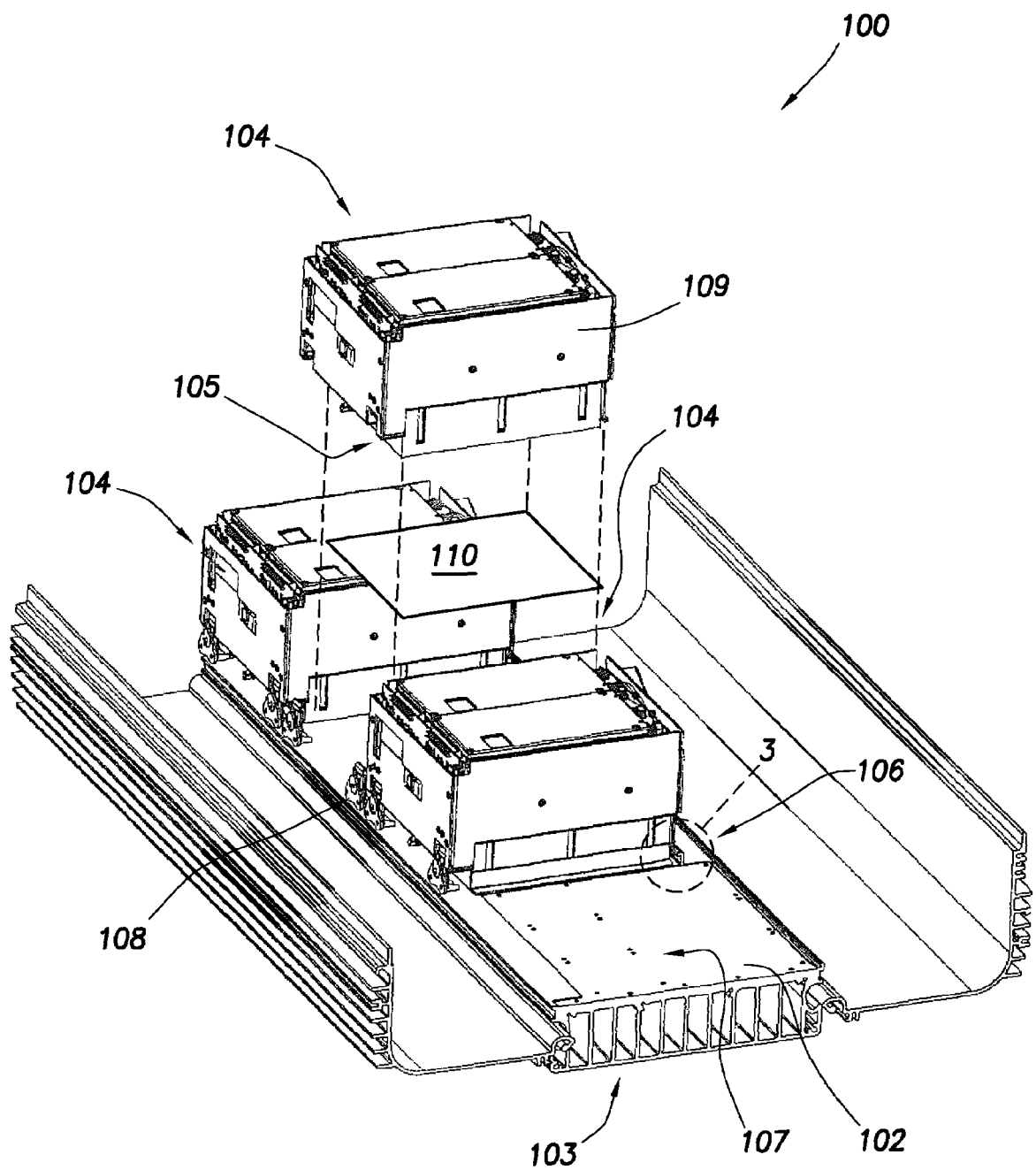
FIG. 1 is a perspective view of one embodiment of a plurality of electronic modules for mounting to a heat dissipating body.

FIG. 1 illustrates one embodiment of an electronics enclosure 100 comprising a heat dissipating body 102 and a plurality of electronic modules 104. In the embodiment illustrated in FIG. 1, electronics enclosure 100 is a telecommunications enclosure, or more specifically, a cabinet holding a plurality of telecommunication electronics. In alternate embodiments, electronics enclosure 100 could be any enclosure containing any type of device. Electronics enclosure 100 is configured to be mounted to an upright structure. For example, in this embodiment, electronics enclosure 100 mounts to an upright structure such that a back side 103 of heat dissipating body 102 is disposed against the upright structure. In one embodiment, electronics enclosure 100 is configured to be mounted to a utility pole such that the electronics within electronics enclosure 100 can be coupled to telecommunication lines, telecommunication antennas, and/or power lines that are on or near the utility pole. In an alternate embodiment, electronics enclosure may be mounted to an existing tower, a tree, a side of a building, or any other upright structure. Electronics enclosure 100 may include devices mounted internally, externally, or both. In one embodiment, electronics enclosure 100 is mounted internally in a utility pole and is accessed via a slide out drawer. More detail regarding an electronics enclosure within a utility pole that is accessed via a slide out drawer is provided in U.S. Patent Application No. 61/060,740, entitled "PULLOUT SHELF" which is hereby incorporated herein by reference.

Electronic modules 104 comprise a plurality of electronics contained within a housing 109 which is configured to be mounted to heat dissipating body 102. As shown in FIG. 1, electronic modules 104 are generally cubical in shape, although, in other embodiments, electronic modules 104 may take on other shapes. One embodiment of electronic modules 104 is shown and described in co-pending U.S. patent application Ser. No. 12/137,322, entitled "RF MODULES" which is hereby incorporated herein by reference.

Electronic modules 104 mount to heat dissipating body 102 via interlocking hooked flanges 106 and a latch mechanism 108. More detail regarding mounting electronic module 104 to heat dissipating body 102, interlocking hooked flanges 106 and latch mechanism 108 is provided below.

In this embodiment, when an electronic module 104 is mounted to heat dissipating body 102, a portion of the heat generated by the electronic module 104 is dissipated through heat dissipating body 102 to the outside environment. In this embodiment, heat dissipating body 102 comprises a heat sink and has at least one heat conducting surface 107 for heat transfer to/from heat dissipating body 102. A heat conducting side 105 (shown in FIG. 1 as the underside of electronic module 104) dissipates heat from the electronics within electronic module 104 to heat conducting surface 107 on heat dissipating body 102. The heat is then transferred through heat dissipating body 102 to the environment surrounding heat dissipating body 102. In one embodiment, both heat conducting side 105 and heat conducting surface 107 are composed of aluminum, however, in other embodiments other heat conductive materials may be used.

In one embodiment, a thermal interface material 110 is placed between heat conducting side 105 and heat conducting surface 107 to increase the heat transfer therebetween. Thermal interface material 110 fills air gaps between heat conducting side 105 and heat conducting surface 107 to increase the thermal transfer efficiency of the interface. Suitable thermal interface materials include thermal pastes, tapes, pads or other substances as are known in the art. For example, in one embodiment thermal interface material 110 is a thermal phase change material on a foil sheet. One example of a suitable thermal phase change material is T-mate™ 2900 Series reusable thermal phase change material made by Laird Technologies®. The thermal phase change material is on one side of the foil sheet, while the other side of the foil sheet has no phase change material. The foil sheet with thermal past thereon is placed between heat conducting side 105 and heat conducting surface 107 such that the side of the foil sheet having the thermal phase change material thereon is against electronic module 104 and the clean side of the foil sheet is against heat dissipating body 104. Thus, most of the phase change material sticks to electronic module 104, such that when electronic module 104 is removed, the phase change material remaining on heat dissipating body 102 is reduced. This enables a new electronic module 104 to be inserted in place of an old electronic module 104 while reducing buildup of phase change material on heat dissipating body 102.

Figure 2:
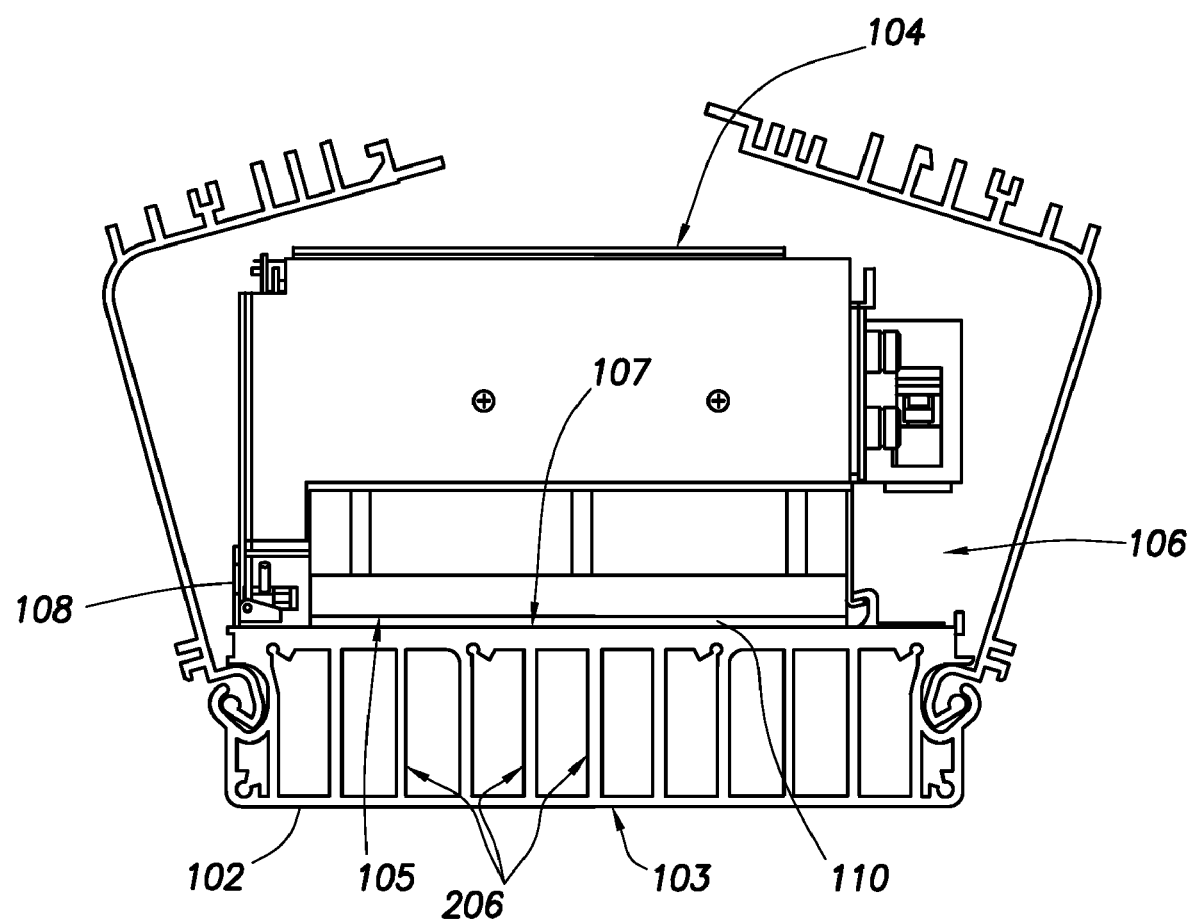
FIG. 2 is a top view of an electronic module of FIG. 1 mounted to a heat dissipating body.

FIG. 2 shows a top view of one embodiment of electronic module 104 mounted to heat dissipating body 102. As shown in FIG. 2, heat conducting side 105 of electronic module 104 is in contact (either direct contact or contact via a thermal interface material) with heat conducting surface 107 of heat dissipating body 102. Heat generated by electronic components within electronic module 104 is transferred from heat conducting side 105 to heat conducting surface 107 of heat dissipating body 102. Once the heat has dissipated from electronic module 104 into heat dissipating body 102, the heat is transferred through heat dissipating body 102 and out to the surrounding environment via apertures 206, back side 103, or other portions of heat dissipating body 102 in contact with the outside environment.

Referring now to FIG. 3, an enlarged perspective view of interlocking hooked flanges 106 is shown. Interlocking hooked flanges 106 comprises one hooked flange 302 on heat dissipating body 102 and another hooked flange 304 on electronic module 104. Hooked flanges 202, 204 are shaped such that hooked flange 302 and hooked flange 304 interlock and hold the respective side of electronic module 104 to heat dissipating body 102. Hooked flange 302 and hooked flange 304 is shown with hooked flange 302 interlocked with hooked flange 304. As shown in FIG. 3, hooked flange 304 extends under hooked flange 302 to restrict movement of electronic module 104 in the directions of arrow 306 and arrow 308.

Referring now to FIGS. 4A and 4B, latch mechanism 108 is shown in both a closed position (4A) and an open position (4B). Latch mechanism 108 comprises two portions, a first part 402 of latch mechanism 108 is on electronic module 104 and the second part 404 of latch mechanism 108 is on heat dissipating body 102. The two parts 402, 404 of latch mechanism 108 are connected and latched as shown in FIG. 4A to secure electronic module 104 to heat dissipating body 102. In the embodiment shown in FIGS. 1, 2, 4A, and 4B latch mechanism 108 is a link-lock type latch.

Latch 108 operates by twisting handle 406 one hundred and eighty (180) degrees to lock and unlock latch 108. Twisting handle 406 moves hook 408 in the direction of arrow 410. In one embodiment, hook 408 has approximately 5/16 of an inch of travel distance. When handle 406 is twisted and hook 408 is released from first part 402, second part 404 can be opened as shown in FIG. 4B and removed from first part 402. When closing latch 108, second part 404 is first closed onto first part 402 to interlock hook 408 with first part 402. Handle 406 is then twisted drawing first part 402 and second part 404 together. The draw action of latch 108 presses heat conducting side 105 against heat conducting surface 107. Although in the embodiment shown in FIGS. 1, 2, and 4 a link-lock latch is used, in other embodiments, other types of latches are used such as a cam latch, a compression latch, a draw latch, or others as known to those in the art.

Figure 5A:
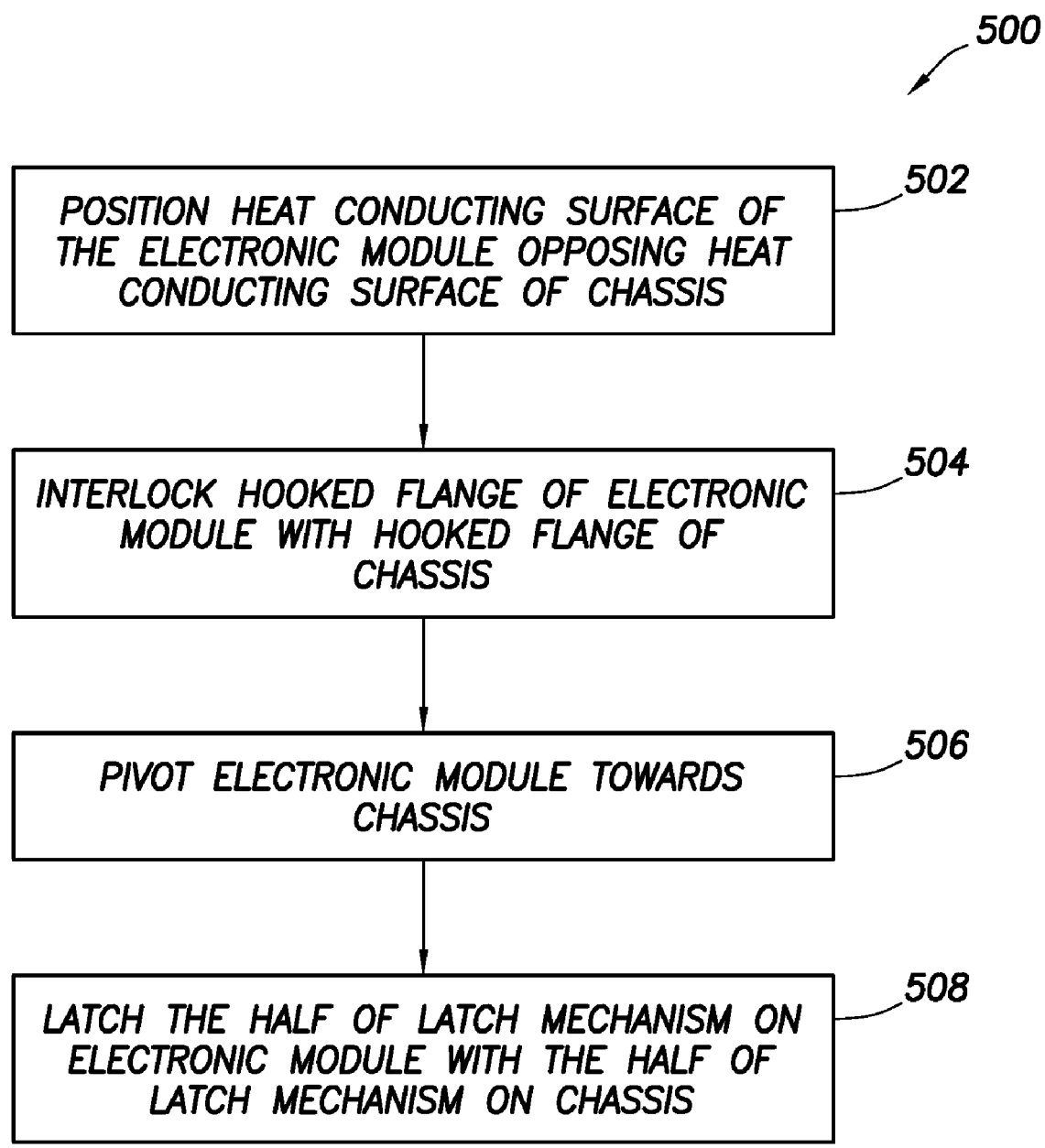
FIG. 5A is a flow chart illustrating one embodiment of a method for mounting an electronic module to a heat dissipating body.
Figure 5C:
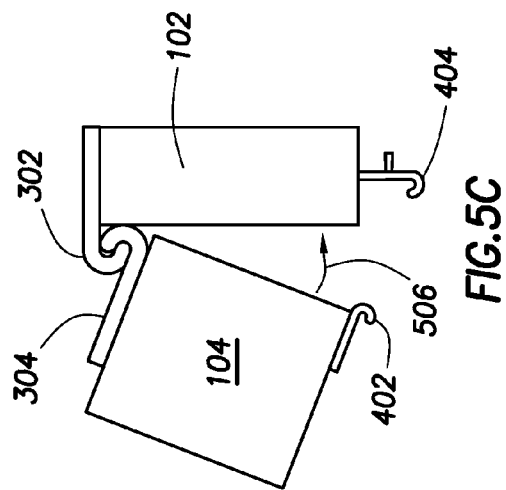
FIGS. 5B, 5C, 5D, and 5E illustrate one embodiment of the steps of the method of FIG. 5A.
Figure 5E:
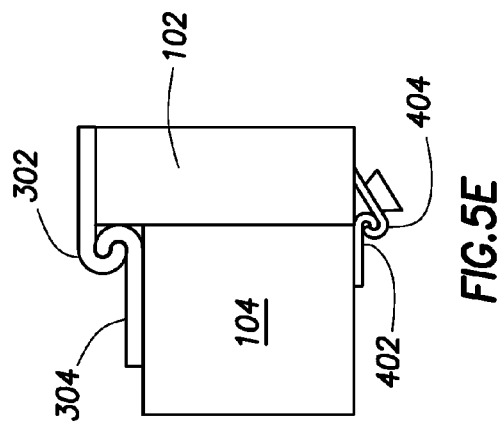
Figure 5B:
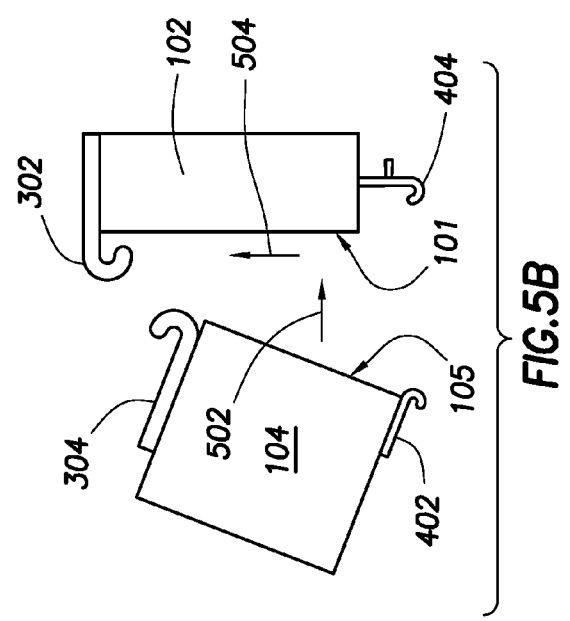
Figure 5D:
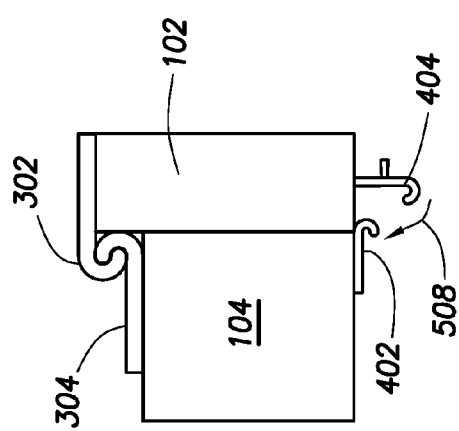

FIGS. 5A-5E illustrates one embodiment of a method 500 of mounting an electronic module to a heat dissipating body. FIG. 5A is a flow chart showing steps of method 500 illustrated as blocks 502, 504, 506, and 508. FIGS. 5B, 5C, 5D, and 5E are illustrations providing additional detail regarding blocks 502, 504, 506, and 508. In this embodiment, method 500 is explained with reference to electronic module 104 and heat dissipating body 102; however, other electronic modules or heat dissipating bodies could be used. At block 502 (shown in FIG. 5B), electronic module 104 is positioned next to heat dissipating body 102 such that heat conduction side 105 and heat conducting surface 107 are opposing each other. Electronic module 104 is then positioned at a slight angle with the corner having hooked flange 204 closer to heat dissipating body 102 and the corner having first part 402 of latch mechanism 108 farther from heat dissipating body 102. At block 504, electronic module 104 is moved first in the direction of arrow 502 and then in the direction of arrow 504 until hooked flange 204 interlocks with hooked flange 302 as shown in FIG. 5C. At block 306, electronic module 104 is pivoted in the direction of arrow 506 using hooked flange 302 as a pivot point. This brings first part 402 of latch mechanism 108 on electronic module 104 adjacent second part 404 of latch mechanism 108 on heat dissipating body 102 as shown in FIG. 5D. At block 308, latch mechanism 108 is latched by moving second part 404 in the direction of arrow 402 and closing latch 108. This secures electronic module 104 to heat dissipating body 102 as shown in FIG. 5E. The corner of electronic module 104 opposite of latch mechanism 108 is secured through the interlocking of hooked flange 302 with hooked flange 304. In addition to securing electronic module 104 to heat dissipating body 102, latch mechanism 108 presses heat conducting side 105 against heat conducting surface 107. This increases heat transfer between heat conducting side 105 and heat conducting surface 107.

Electronic module 104 is removed by performing the opposite of the mounting steps of method 500 described above, in the reverse direction. First, latch mechanism 108 is released. Electronic module 104 is then pivoted away from heat dissipating body 102 using interlocking hooked latches 106 as the pivot point. Electronic module 104 is then slid away from heat dissipating body 102 to release hooked flange 302 from hooked flange 204. Electronic module 104 is now free from heat dissipating body 102.

Advantageously, mounting electronic modules 104 to heat dissipating body 102 with interlocking hooked flanges 106 and latch mechanism 108 enables electronic modules 104 to be inserted, secured to heat dissipating body, and removed without the use of any tools. Additionally, removable electronic modules 104 make upgrades and repairs easier as an electronic module 104 can be removed for repair and/or replaced with a new electronic module 104. Finally, interlocking hooked flanges 106 are low in complexity and cost and enable the corresponding portions of heat dissipating body 102 and electronic module 104 to be formed through extrusion.

Figure 6:
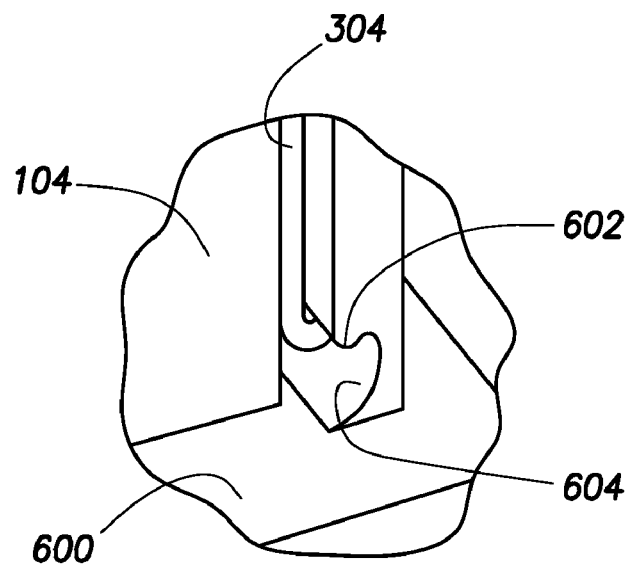
FIG. 6 is a perspective view of an alternate embodiment of a hooked flange of an electronic module coupled with a hooked flange of a heat dissipating body.

Although in the illustration shown in FIG. 2 hooked flanges 302, 304 are curved backwards slightly (toward their respective structures) in other embodiments, hooked flanges 302, 304 are curved at right angles, curved backwards more than shown in FIG. 2, curved at other angles, or comprise a different shape. In yet other embodiments, one or both of hooked flanges 302, 304 are incorporated into other elements of their respective structures. For example, FIG. 6 illustrates an alternative embodiment in which a hooked flange 602 is incorporated into a groove 604 in a heat dissipating body 600 to which hooked flange 304 interlocks.

Figure 7:
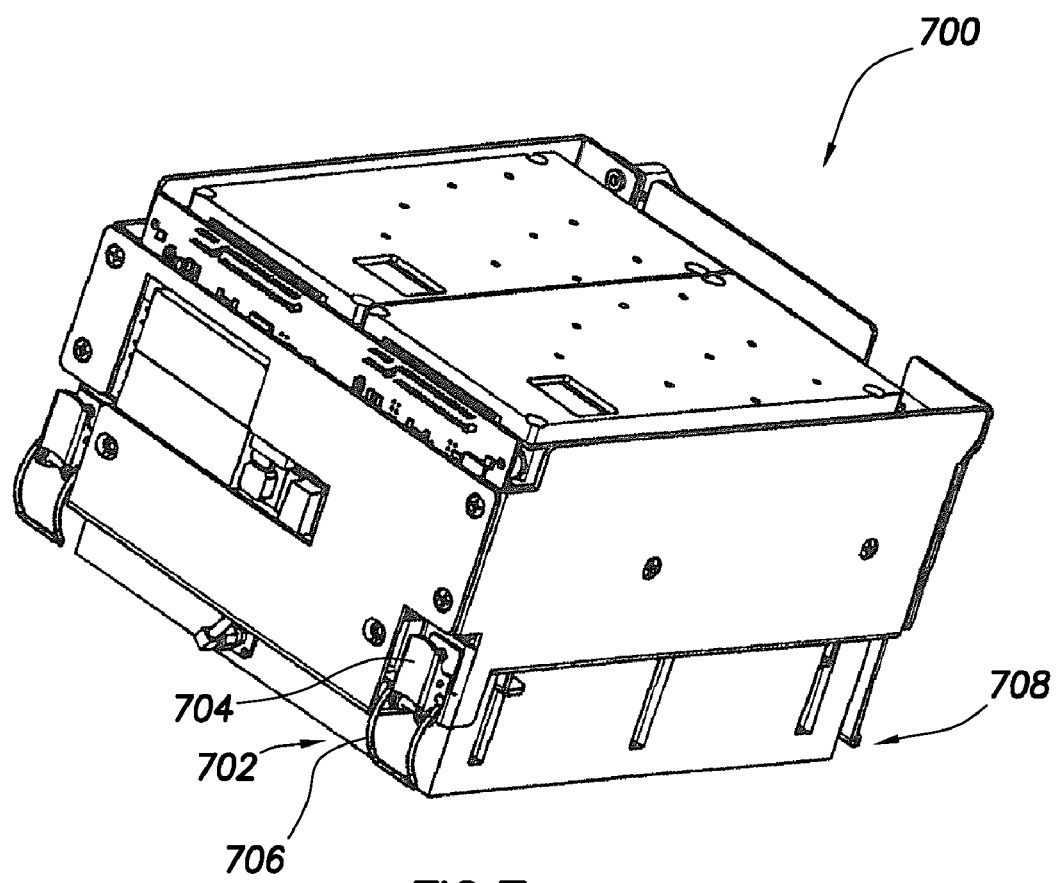
FIG. 7 is a perspective view of one embodiment of an electronic module having an alternative embodiment of a latch mechanism.
Figure 8:
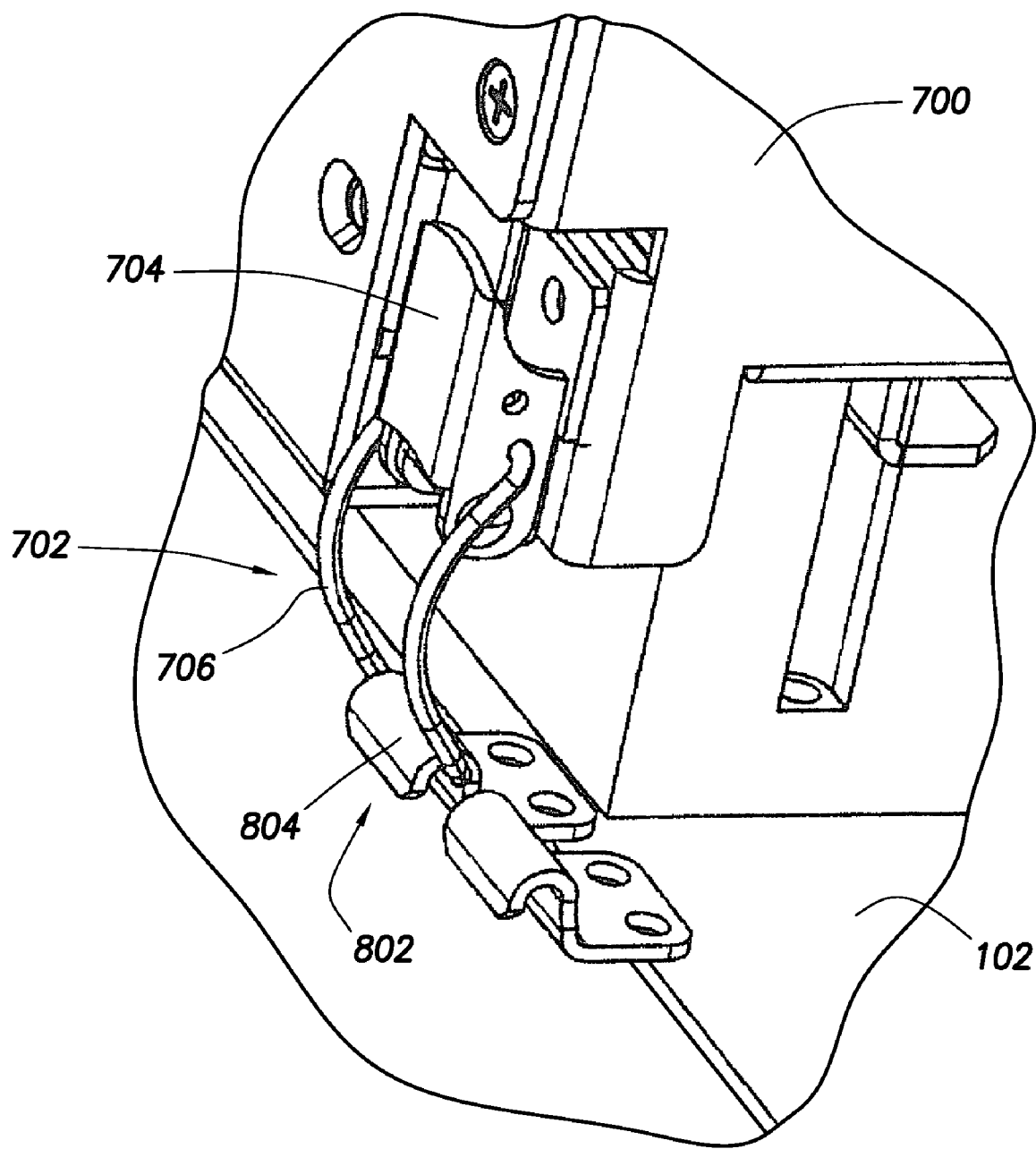
FIG. 8 is a perspective view of one embodiment of the latch mechanism of FIG. 7 and the mating latch mechanism on a heat dissipating body.

Referring now to FIG. 7, an alternative embodiment of an electronic module 700 is shown. Electronic module 700 comprises a first part 702 of a latch mechanism. First part 702 of the latch mechanism comprises a handle 704 and a loop portion 706. Handle 704 opens to extend loop portion 706, and closes to act as a lever and draw loop portion 706 in toward electronic module 700. A second part 802 of latch mechanism on heat dissipating body 102 is shown in FIG. 8 and explained in more detail below. Electronic module 700 also comprises a hooked flange 708, which is similar in construction and function to hooked flange 204 explained with reference to FIGS. 2 and 3 above.

FIG. 8 illustrates an enlarged view of first part 702 of the latch mechanism in a closed position and locked with a second part 802 of the latch mechanism. Second part 802 of the latch mechanism is mounted on heat dissipating body 102. To close the latch mechanism, handle 704 is opened and loop portion 706 of first part 702 of the latch mechanism is placed in bent portion 804 of second part 802 of latch mechanism 702. Handle 704 is then closed to pull electronic module 700 toward heat dissipating body 102. In general, mounting electronic module 700 to heat dissipating body 102 is done with a process similar to that described with respect to electronic module 104 and FIGS. 2, 3, 4, and 5A-5E. To release first part 702 of the latch mechanism from second part 802 of the latch mechanism, handle 704 is opened, loop portion 706 is removed from bent portion 804 and electronic module 700 can be pulled away from heat dissipating body 102 as explained with reference to FIGS. 5A-5E above.

Figure 9A:
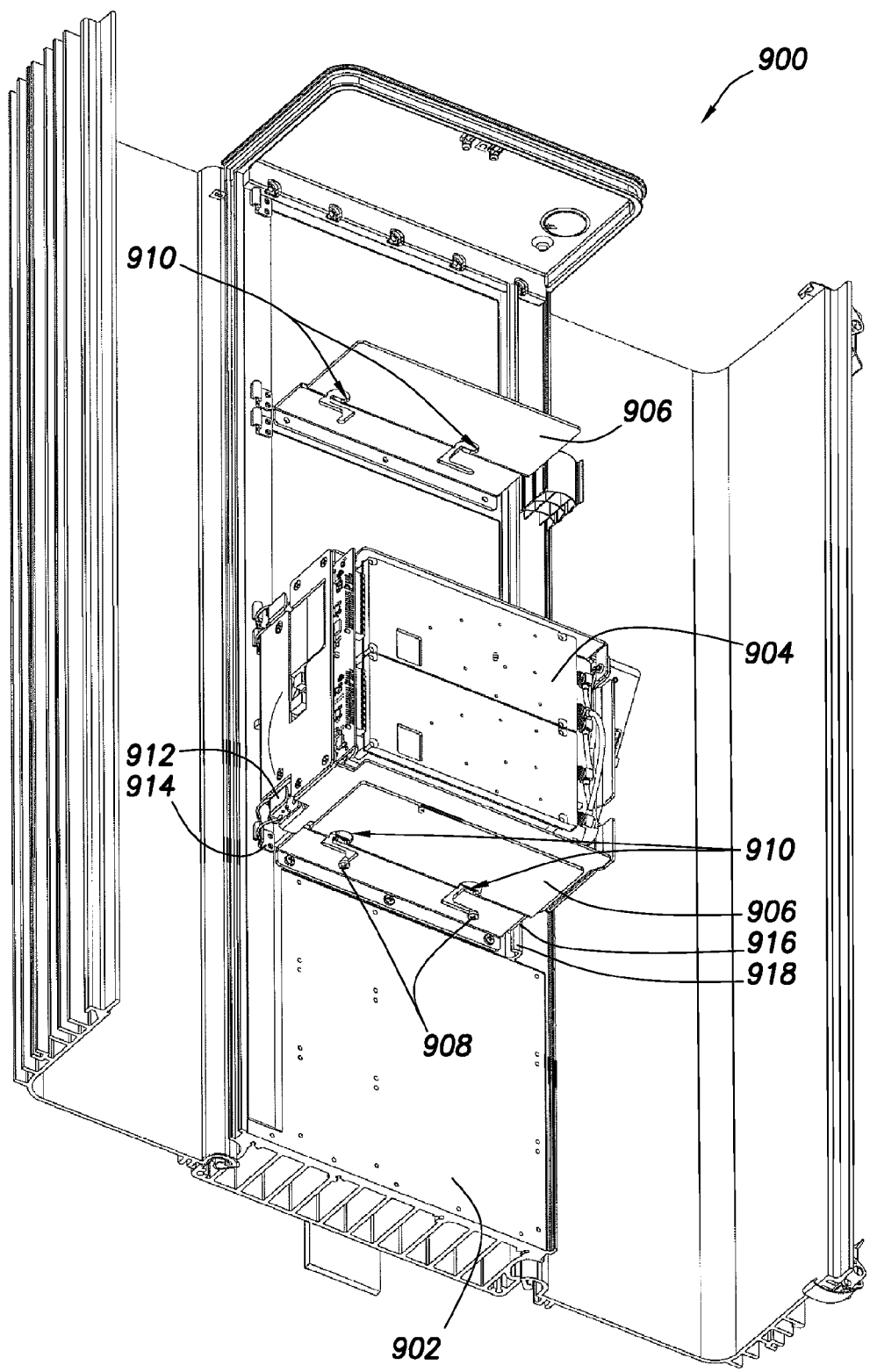
FIG. 9A is a perspective view and FIG. 9B is a corresponding bottom view of another embodiment of an electronic module mounted to a heat dissipating body with the use of a shelf.
Figure 9B:
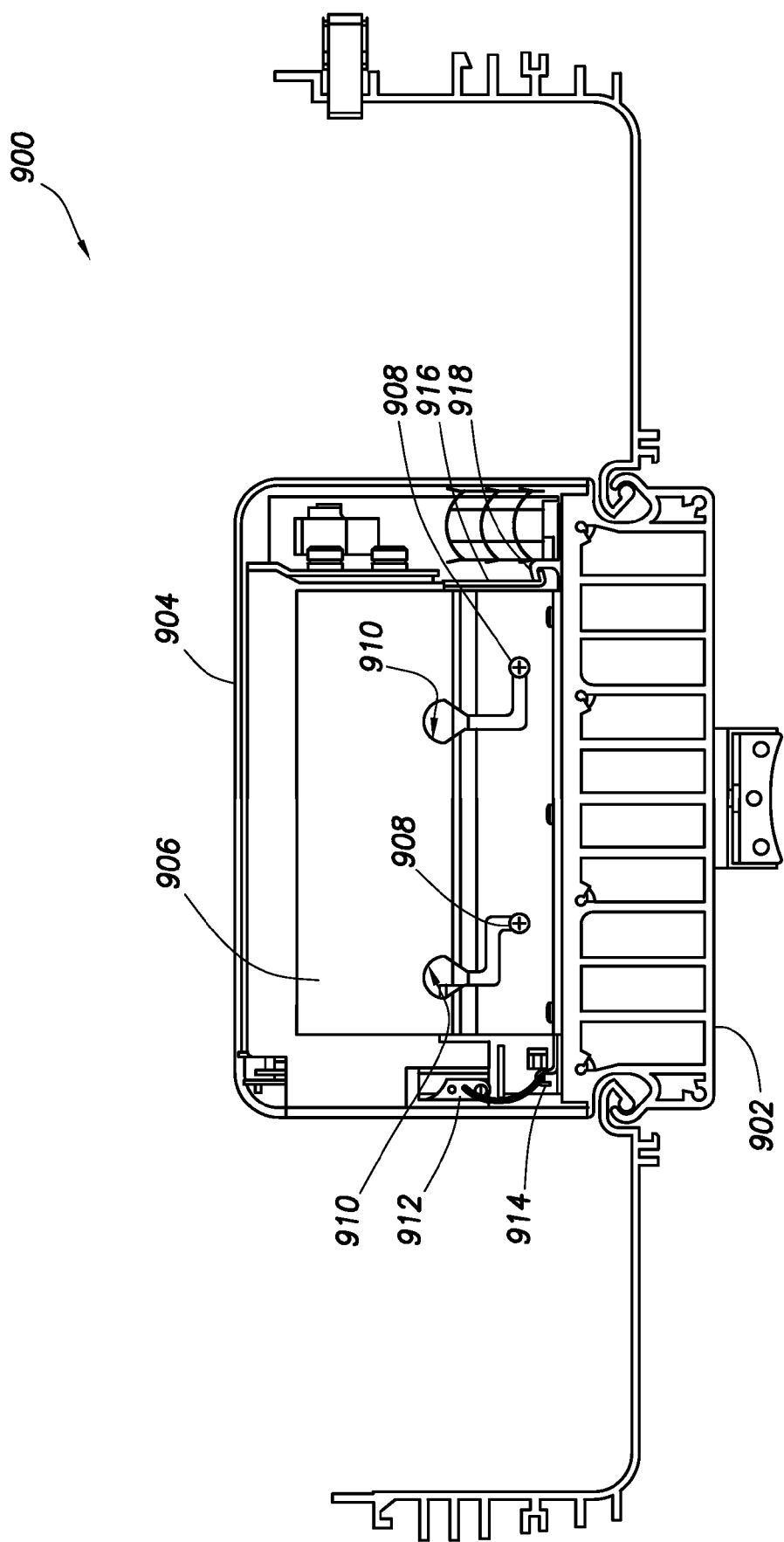

FIGS. 9A and 9B illustrate alternative embodiments of an electronics enclosure 900 having a heat dissipating body 902 and an electronic module 904 mounted thereto. Heat dissipating body 902 is similar in design and function to heat dissipating body 102 described above. Heat dissipating body 902, however, comprises a plurality of shelves 906 for guiding the mounting of electronic module 904 to heat dissipating body 902. Electronic module 904 is similar in design and function to electronic module 104. Electronic module 904, however, comprises at least one feature 908 for working with shelf 906 to guide the mounting of electronic module 904 with heat dissipating body 902.

In the embodiment shown in FIGS. 9A and 9B, feature 908 is a post that extends outward from electronic module 904 and fits into a slot 910. As shown in FIGS. 9A and 9B, electronic module comprises two features 908 and shelf 906 comprises two corresponding slots 910. In other embodiments, a single feature 908 and corresponding slot 910, or more than two features 908 and corresponding slots 910 are used. In this embodiment, the post of feature 908 comprises a standoff with a bolt placed through the standoff; however, in other embodiments other structures may be used as a post such as an integrally formed elongation or other structures. Additionally, in other embodiments, shelf 906 includes a post that extends outward from shelf 906 and fits into a groove or slot within electronic module 904 and is used to guide the mounting of electronic module 904 with heat dissipating body 902.

In this embodiment, shelf 906 extends outward from heat dissipating body 102 and are oriented such that electronic module 904 is placed above shelf 906 and may rest and slide upon shelf 906 during mounting. In other embodiment, shelf 906 is located on heat dissipating body 902 such that electronic module 904 is mounted below shelf 906 and features 908 connect with shelf 906 such that electronic module 904 is supported by shelf 906 during mounting.

In this embodiment, electronic module 904 comprises a first part 912 of a latch mechanism that interlocks with a second part 914 of a latch mechanism on heat dissipating body 902. First part 912 of latch mechanism is similar in design and function to first part 704 of latch mechanism in FIG. 7. Similarly second part 914 of latch mechanism is similar in design and function to second part 706 of latch mechanism in FIG. 7. Electronic module 904 also comprises a first hooked flange 916 that interlocks with a second hooked flange 918 on heat dissipating body 902. First hooked flange 916 is similar in design and function to hooked flange 304 in FIG. 3. Likewise, second hooked flange 918 is similar in design and function to hooked flange 302 in FIG. 3.

Figure 10:
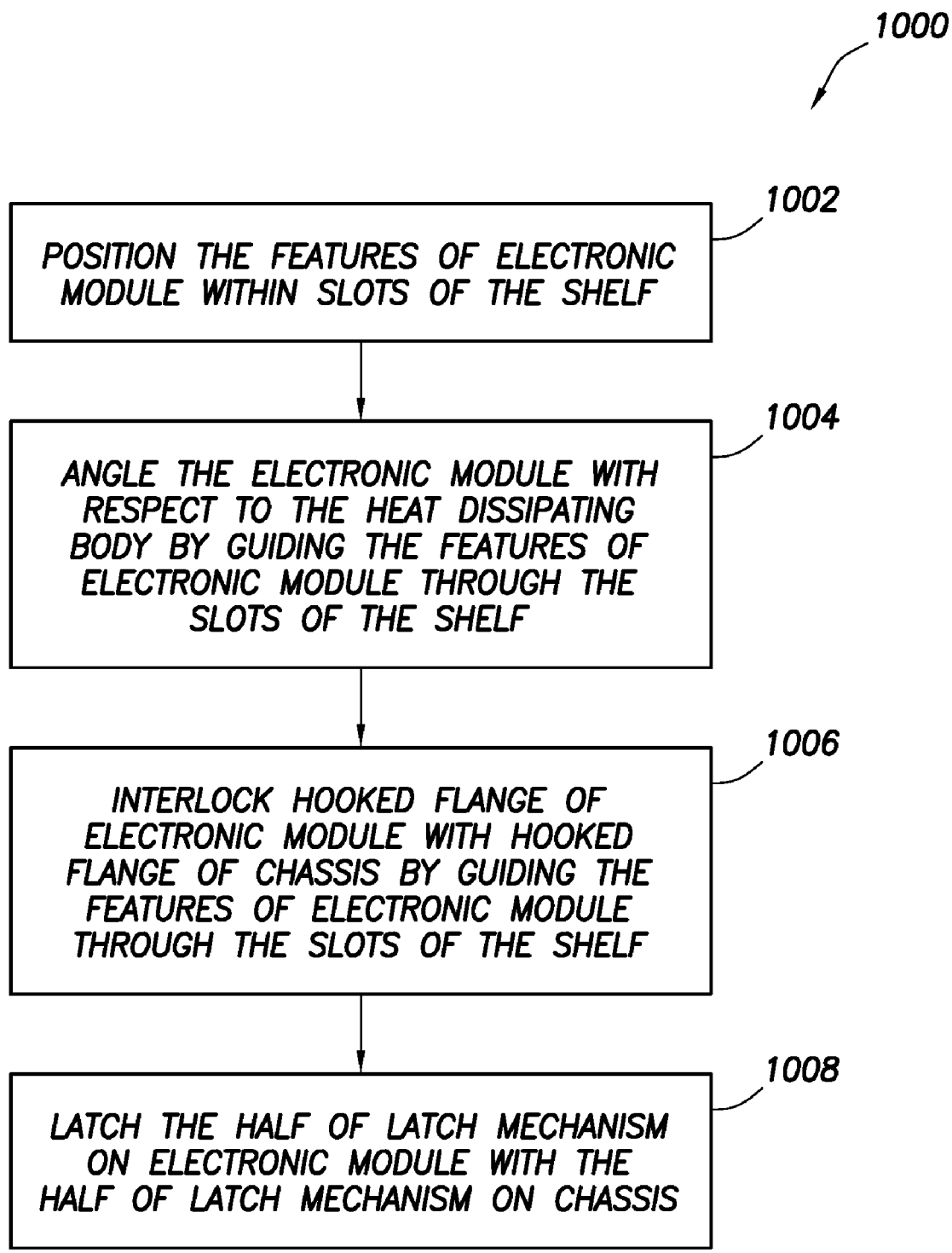
FIG. 10 is a flow chart illustrating one embodiment of a method for mounting an electronic module to a heat dissipating body with the use of a shelf.

FIG. 10 is a flow chart for one embodiment of a method 1000 of mounting an electronic module to a heat dissipating body with the use of a shelf 906. Method 1000 illustrates steps as blocks 1002, 1004, 1006, and 1008. Additionally, FIGS. 11A, 11B, 12A, 12B, 13A, 13B, as well as 9A and 9B are illustrations providing additional detail regarding blocks 1002, 1004, 1006, and 1008. Block 1002, 1004, 1006, and 1008 correspond to the following FIGs.: block 1002—FIGS. 11A and 11B; block 1004—FIGS. 12A and 12B, block 1006—FIGS. 13A and 13B; and block 1008—FIGS. 9A and 9B. Each of the 'A' figures of 9, 11, 12, and 13 illustrate a perspective view of electronics enclosure 900, heat dissipating body 902, and electronic module 904, and each of the 'B' figures of 9, 11, 12, and 13 illustrate a bottom view of the same numbered corresponding 'A' figure.

Figure 11A:
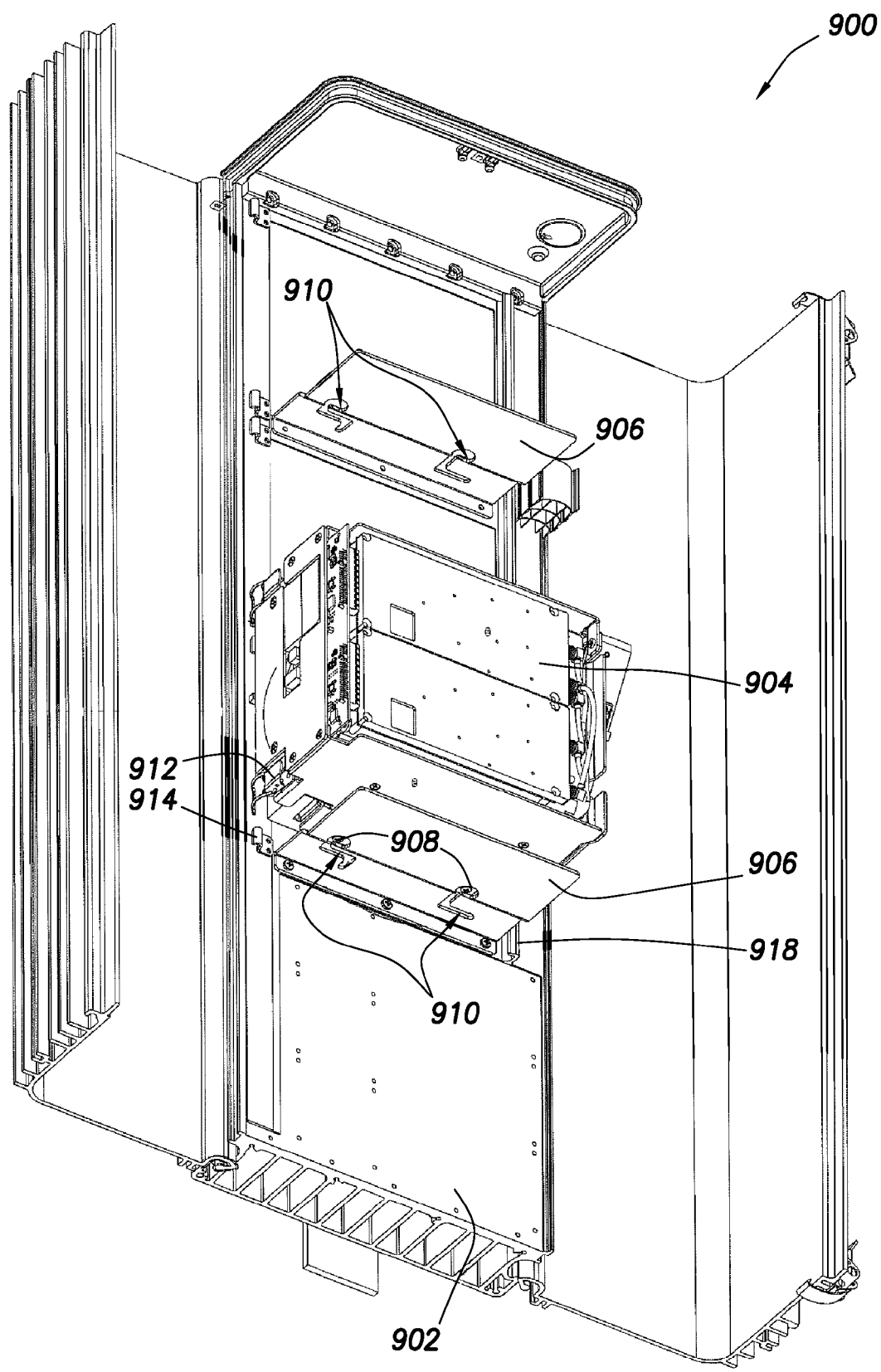
FIG. 11A is a perspective view and FIG. 11B is a corresponding bottom view of another embodiment of an electronic module mounted to a heat dissipating body with the use of a shelf.
Figure 11B:
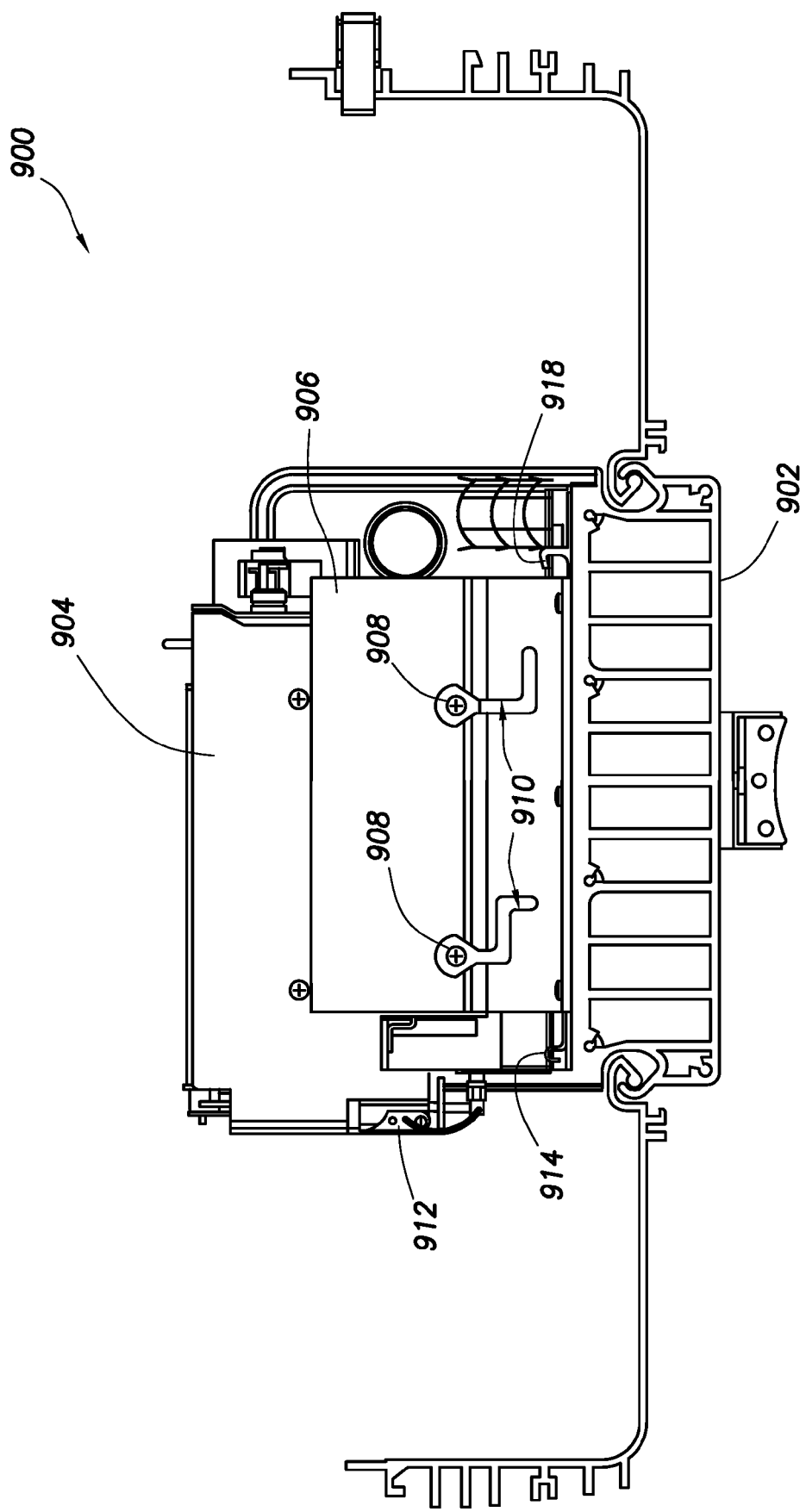
Figure 12A:
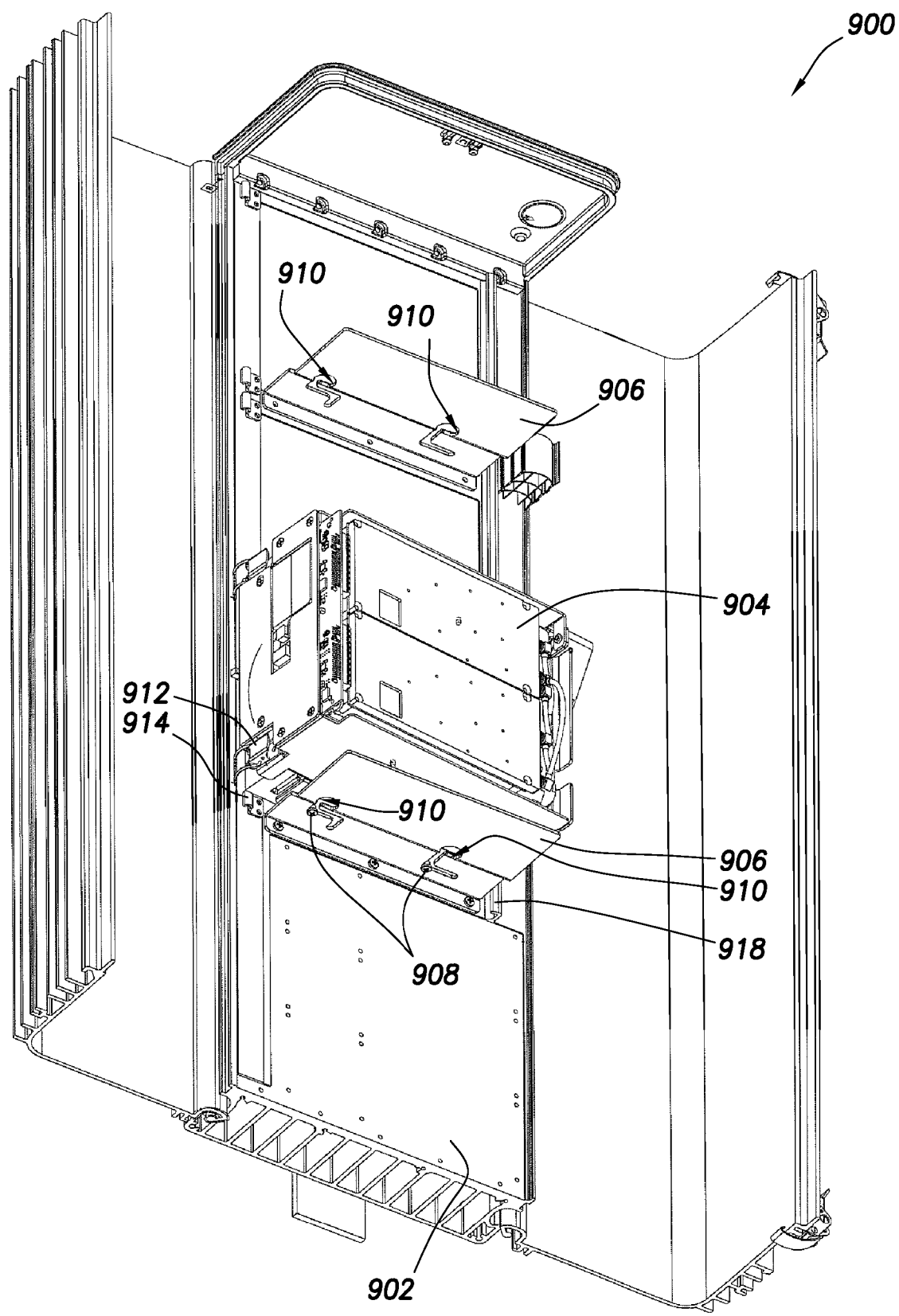
FIG. 12A is a perspective view and FIG. 12B is a corresponding bottom view of another embodiment of an electronic module mounted to a heat dissipating body with the use of a shelf.
Figure 12B:
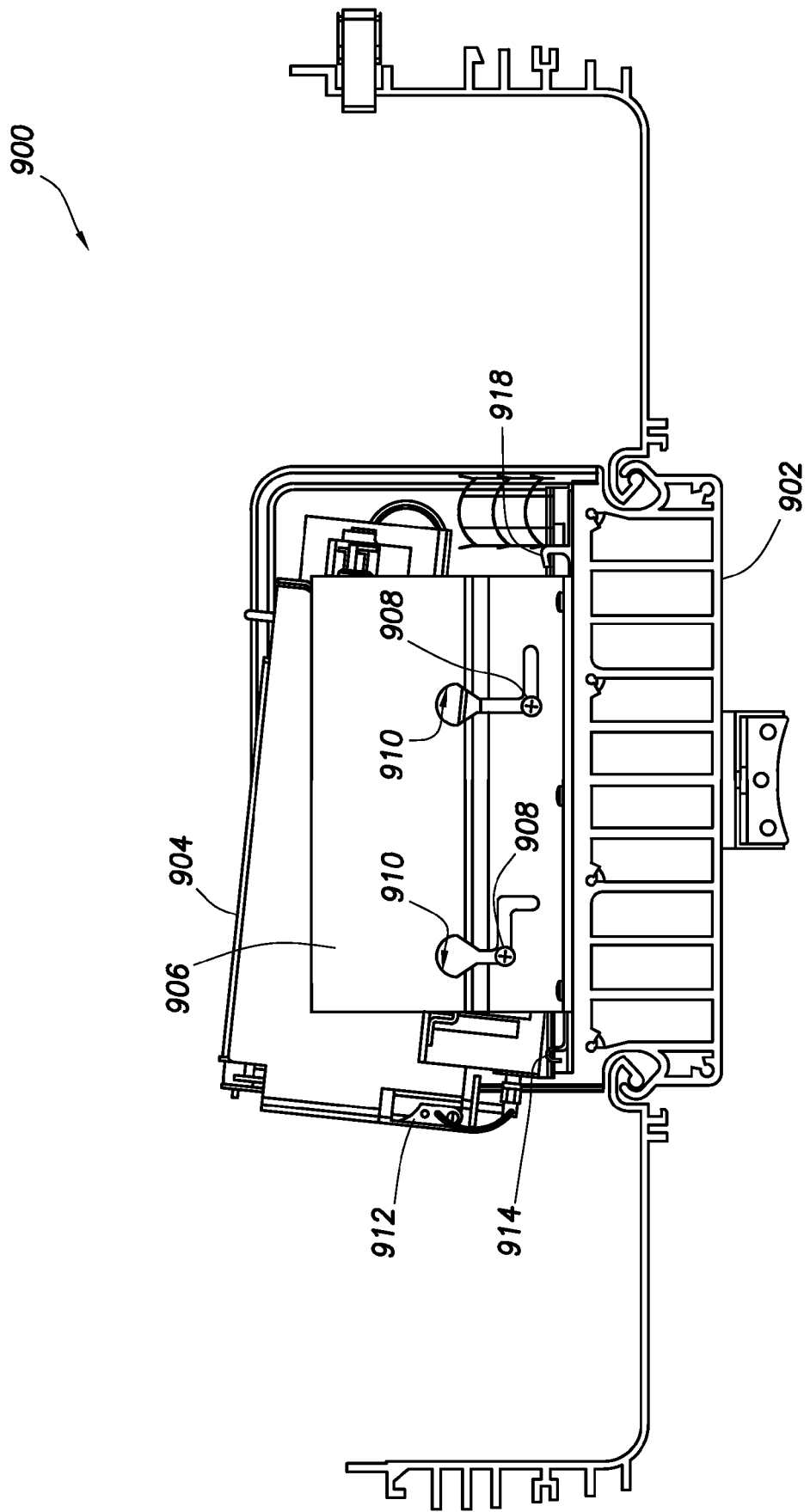

In this embodiment, method 900 is explained with reference to electronic module 904 and heat dissipating body 904; however, other electronic modules or heat dissipating bodies could be used. At block 1002 (shown in FIGS. 11A and 11B), electronic module 104 is positioned above shelf 906. Electronic module 104 is positioned such that features 908 extend into slots 910. Slots 910 have a width corresponding to a thickness of features 908. Slots 910 are wide enough to enable features 908 to slide through, but narrow enough such that features 908 are positively guided through slots 910. Additionally, in one embodiment, features 908 have a slightly larger head that helps hold features 908 in slots 910. Slots 910 have an insertion portion that has a larger width than the rest of slot 910. The insertion portion enables the larger head of slots 910 to extend through and past slots such that a narrow body of features 908 can slide through slots 910. Thus, at block 1002, electronic module 104 is positioned such that features 908 extend into the insertion portion of slots 910 as shown in FIGS. 11A and 11B. Electronic module 104 is positioned such that that a heat conduction side of electronic module 104 and a heat conducting surface of heat dissipating body 102 are opposing each other as explained with reference to FIGS. 5A-5E.

Once features 908 are inserted into slots 910, slots 910 act as guides to direct the movement of electronic module 904 through the rest of the mounting process. The different shapes of the two slots 910 on shelf 906 angle and direct electronic module 904 through the proper steps to enable mounting of electronic module 904 to heat dissipating body 902. Although in this embodiment, a certain shape of each slot 910 is shown, in other embodiments, other shapes may be used to accommodate different mounting schemes, latch mechanisms, flanges, or other differences.

Figure 13A:
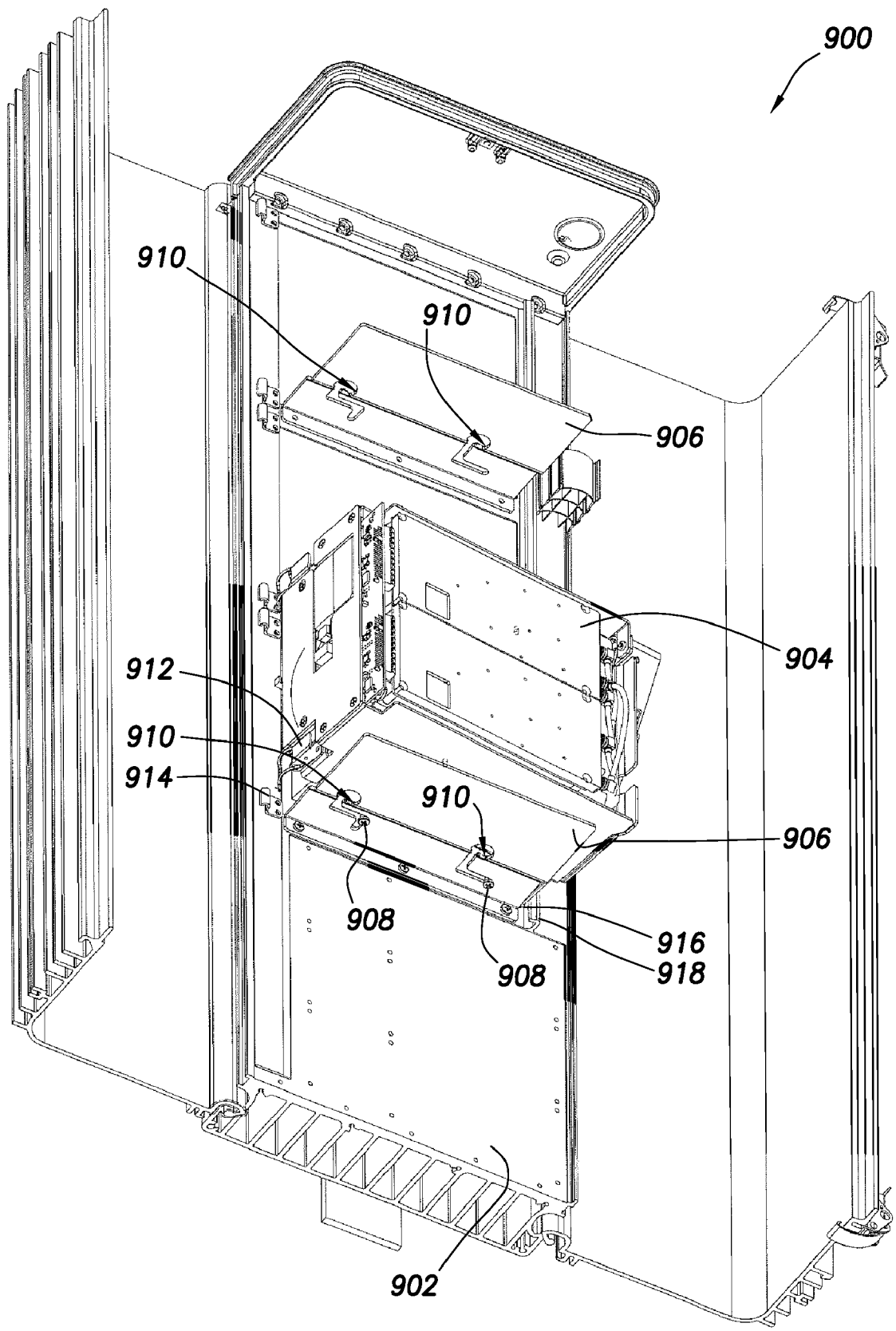
FIG. 13A is a perspective view and FIG. 13B is a corresponding bottom view of another embodiment of an electronic module mounted to a heat dissipating body with the use of a shelf.
Figure 13B:
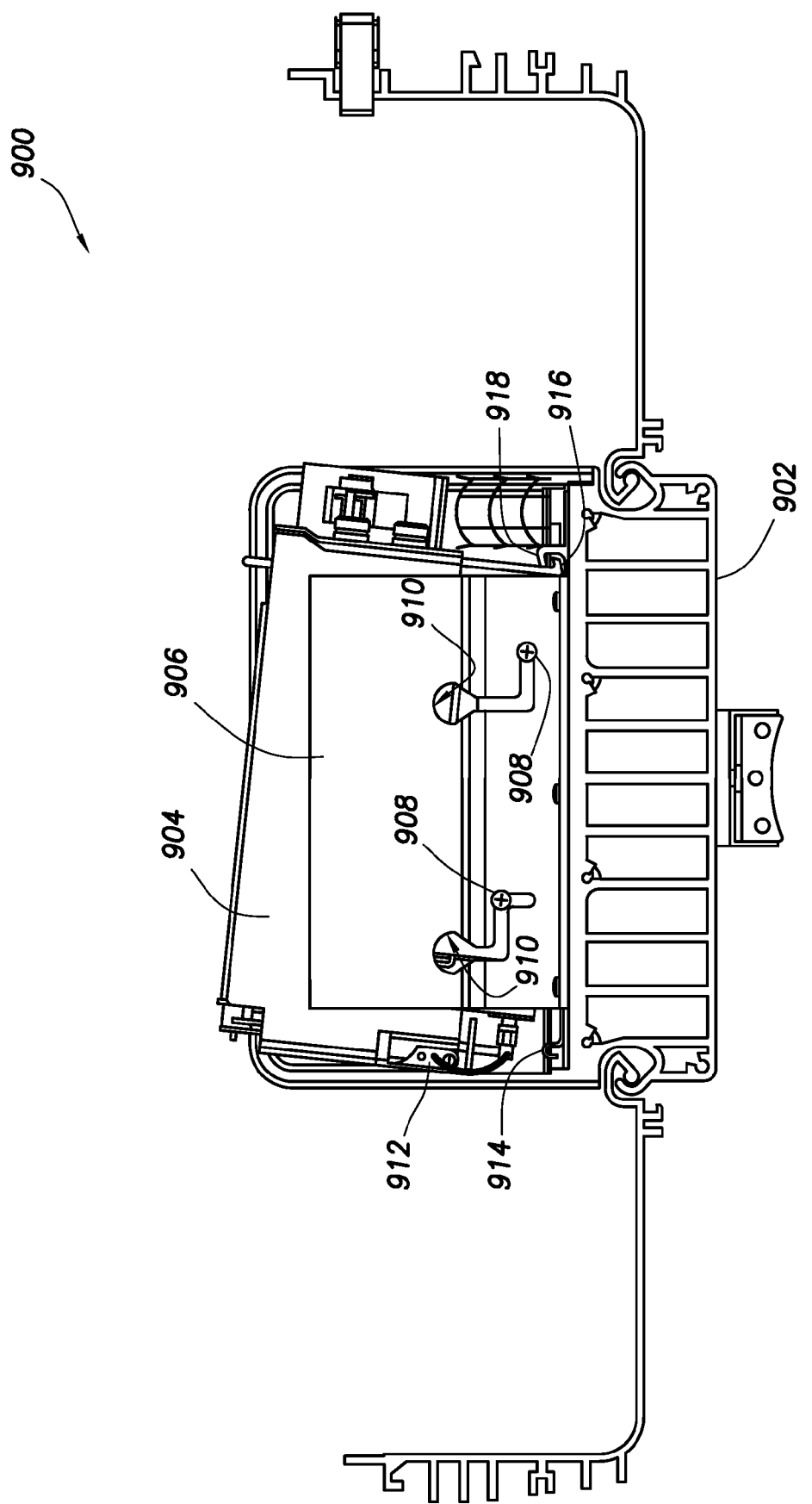

At block 1004 (shown in FIGS. 12A and 12B), electronic module 904 is moved towards heat dissipating body 905 and angled with the corner having hooked flange 916 closer to heat dissipating body 902 and the corner having the first part 912 of latch mechanism farther from heat dissipating body 902. This place hooked flange 916 at the proper angle for interlocking hooked flange 916 with hooked flange 918. At block 1006, electronic module 904 is moved such that hooked flange 916 moves towards hooked flange 918 as shown in FIGS. 13A and 13B. At block 1008, electronic module 904 is pivoted using hooked flange 916 as a pivot point. This brings first part 912 of latch mechanism on electronic module 904 adjacent to the second part 914 of latch mechanism on heat dissipating body 902 and interlocks hooked flange 916 with hooked flange 918 as shown in FIGS. 9A and 9B. First part 912 of latch mechanism is then latched as shown in FIGS. 9A and 9B. This secures electronic module 904 to heat dissipating body 902. The corner of electronic module 904 opposite of the latch mechanism is secured through the interlocking of hooked flange 916 with hooked flange 918.

Electronic module 904 is removed by performing the opposite of the mounting steps of method 1000 described above, in the reverse direction. First, first part 912 latch mechanism is released from second part 914 of latch mechanism. Electronic module 904 is then pivoted away from heat dissipating body 902 using interlocking hooked latches 916, 918 as a pivot point. Electronic module 904 is then slid away from heat dissipating body 902 to release hooked flange 916 from hooked flange 918. Once electronic module 904 is positioned such that features 908 are within insertion portions of slots 910, electronic module 902 is lifted off of shelf 906 and is now free from heat dissipating body 902.

Advantageously, shelves 906 aid in mounting electronic module 904 to heat dissipating body 902. For example, electronic modules 904 enable a service person to rest and slide the electronic module 904 along shelf 906, thus reducing the amount of weight lifting required of the serviceperson and reducing the chances of dropping electronic module 904. Additionally, shelves 906 act as a guide, increasing the likelihood of proper mounting of electronic module 904 to heat dissipating body 902.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An electronics enclosure comprising:
   a heat dissipating body comprising:
      a heat sink having a heat conducting surface;
      a first flange adjacent to the heat conducting surface; and
      a first part of a latch mechanism adjacent to the heat conducting surface;
      wherein the first part of the latch mechanism is adjacent an edge of the heat conducting surface opposite to the first flange, such that a portion of the heat conducting surface is between the first flange and the first part of the latch mechanism; and
   a plurality of electronic modules configured to mount to the heat dissipating body,
   each of the plurality of electronic modules comprising:
      a plurality of electronic components;
      a plurality of features;
      a heat conducting side configured to contact the heat conducting surface of the heat dissipating body;
      a second flange adjacent the heat conducting side, the second flange configured to couple with the first flange; and
      a second part of the latch mechanism adjacent the heat conducting side, the second part of the latch mechanism configured to couple with the first part of the latch mechanism;
      wherein the second flange and the second part of the latch mechanism are on opposite edges of the heat conducting side; and
      the heat dissipating body
   further comprises at least one shelf for guiding the mounting of the electronic module to the heat dissipating body, the at least one shelf comprising at least one slot with one of a generally Z or L shape;
      wherein at least one of the plurality of features engage one of the at least one generally Z or L shape slot.

2. The electronics enclosure of claim 1, wherein each latch mechanism is configured to press the heat conducting side of the respective electronic module into the heat conducting surface of the heat dissipating body.

3. The electronics enclosure of claim 1, further comprising a thermal material between the heat conducting side of the electronic module and the heat conducting surface of the heat dissipating body;
   wherein the thermal material is disposed on a foil sheet and the thermal material with foil sheet is placed on the electronic module with the foil facing outward from the electronic module.

4. The electronics enclosure of claim 1, wherein the latch is selected from a group consisting of: a link-lock latch, a draw latch, a cam latch, and a compression latch.

5. The electronics enclosure of claim 1, wherein the latch is operable to close and open without the use of a tool.

6. The electronics enclosure of claim 1, wherein the first flange and the second flange are hooked flanges.

7. An electronic module configured to mount to a heat dissipating body
   comprising:
      a plurality of electronic components;
      a plurality of features;
      a heat conducting side configured to contact a heat conducting surface of a heat dissipating body;
      a flange adjacent the heat conducting side, the flange configured to couple with a second flange on a heat dissipating body; and
      a first part of a latch mechanism adjacent the heat conducting side, the first part of the latch mechanism configured to couple with a second part of the latch mechanism on a heat dissipating body;
      wherein the flange and the first part of a latch mechanism on opposite edges of the heat conducting side; and
      at least one of the features for working with a shelf to guide the electronic module during mounting of the electronic module to a heat dissipating body; and
      the shelf comprising at least one slot with one of a generally Z or L shape;
      wherein at least one of the plurality of features engage one of the at least one generally Z or L shape slot.

8. The electronic module of claim 7, wherein the first part of the latch mechanism is configured to operate with a second part of the latch mechanism to press the heat conducting side of the electronic module into a heat conducting surface of a heat dissipating body.

9. The electronics enclosure of claim 7, further comprising a thermal material on the heat conducting side of the electronic module.

10. The electronics enclosure of claim 9, wherein the thermal material is a thermal phase change material having a foil surface that faces outward from the heat conducting side.

11. The electronics enclosure of claim 7, wherein the latch is operable to close and open without the use of a tool.

12. The electronics enclosure of claim 7, wherein the flange is a hooked flange.

13. A method of installing an electronic module without the use of tools, the method comprising:
   positioning the electronic module with a heat conducting surface on the electronic module opposing a heat conducting surface on a heat dissipating body;
   interlocking a first flange on the electronic module with an second flange on the heat dissipating body;
   pivoting the electronic module towards the heat dissipating body with the interlocking first flange and second flange acting as a pivot point; and
   latching a first part of a latch mechanism on a side of the electronic module opposite to the first flange with a second part of a latch mechanism on the heat dissipating body, such that a heat conducting side on the electronic module is in contact with the heat conducting surface on the heat dissipating body; and
   guiding the mounting of the electronic module with a generally Z or L shaped slot in a shelf on the heat dissipating module and at least one feature on the electronic module.

14. The method of claim 13, further comprising:
   inserting a thermal material between the heat conducting surface of the electronic module and the heat conducting surface of the heat dissipating body.

15. The method of claim 13, wherein the first flange and the second flanges are hooked flanges.

16. The electronic enclosure of claim 1, wherein the first part of a latch mechanism includes one of a hook or loop for engaging a corresponding hook or loop of the second part of the latch mechanism.

17. The electronics enclosure of claim 7, wherein the at least one feature for working with a shelf to guide the electronic module comprises at least one slot formed in the shelf and a corresponding post formed on a side of the electronic module.

18. The electronic enclosure of claim 6, wherein the hooked flanges comprise an arc at the end of a post.

* * * * *